(12) United States Patent
Kim et al.

(10) Patent No.: US 9,559,330 B2
(45) Date of Patent: Jan. 31, 2017

(54) ORGANIC LIGHT EMITTING DIODE DISPLAY

(71) Applicant: Samsung Display Co., Ltd., Yongin, Gyeonggi-do (KR)

(72) Inventors: Hee Kyung Kim, Yongin (KR); Byoung Ki Kim, Yongin (KR); Il Hun Seo, Yongin (KR); Ho Jin Yoon, Yongin (KR); Yun-Mo Chung, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/809,506

(22) Filed: Jul. 27, 2015

(65) Prior Publication Data
US 2016/0211307 A1    Jul. 21, 2016

(30) Foreign Application Priority Data
Jan. 16, 2015 (KR) .................. 10-2015-0008150

(51) Int. Cl.
*H01L 51/52*        (2006.01)
*H01L 27/32*        (2006.01)

(52) U.S. Cl.
CPC ....... *H01L 51/5225* (2013.01); *H01L 27/3246* (2013.01); *H01L 27/3258* (2013.01); *H01L 27/3269* (2013.01); *H01L 51/5209* (2013.01); *H01L 51/5218* (2013.01); *H01L 2251/5315* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 9,167,994 B2 * 10/2015 Akiyama ............. H01L 27/288
2013/0343087 A1   12/2013 Huang
2014/0009960 A1    1/2014 Miyamoto et al.

FOREIGN PATENT DOCUMENTS

JP           4840304      10/2011
JP           5145723      12/2012
KR    10-2011-0121621    11/2011

* cited by examiner

*Primary Examiner* — Quoc Hoang
(74) *Attorney, Agent, or Firm* — Knobbe Martens Olson & Bear LLP

(57) ABSTRACT

An organic light emitting diode display includes: a substrate; an interlayer insulating layer on the substrate; driving source and drain electrodes on the interlayer insulating layer and facing each other; a planarizing layer on the interlayer insulating layer; a pixel electrode on the planarizing layer and including a reflective electrode; a pixel defining layer on an edge portion of the pixel electrode and the planarizing layer, and including an opening for exposing the pixel electrode and a reflective hole for exposing a part of the interlayer insulating layer; an organic emission layer on the pixel electrode within the opening; a common electrode on the organic emission layer and the pixel defining layer and within the reflective hole, and including a transparent electrode; and an optical sensor under the substrate, in which the reflective hole moves light emitted from the organic emission layer to the optical sensor under the substrate.

16 Claims, 11 Drawing Sheets

FIG. 9
Replacement Sheet
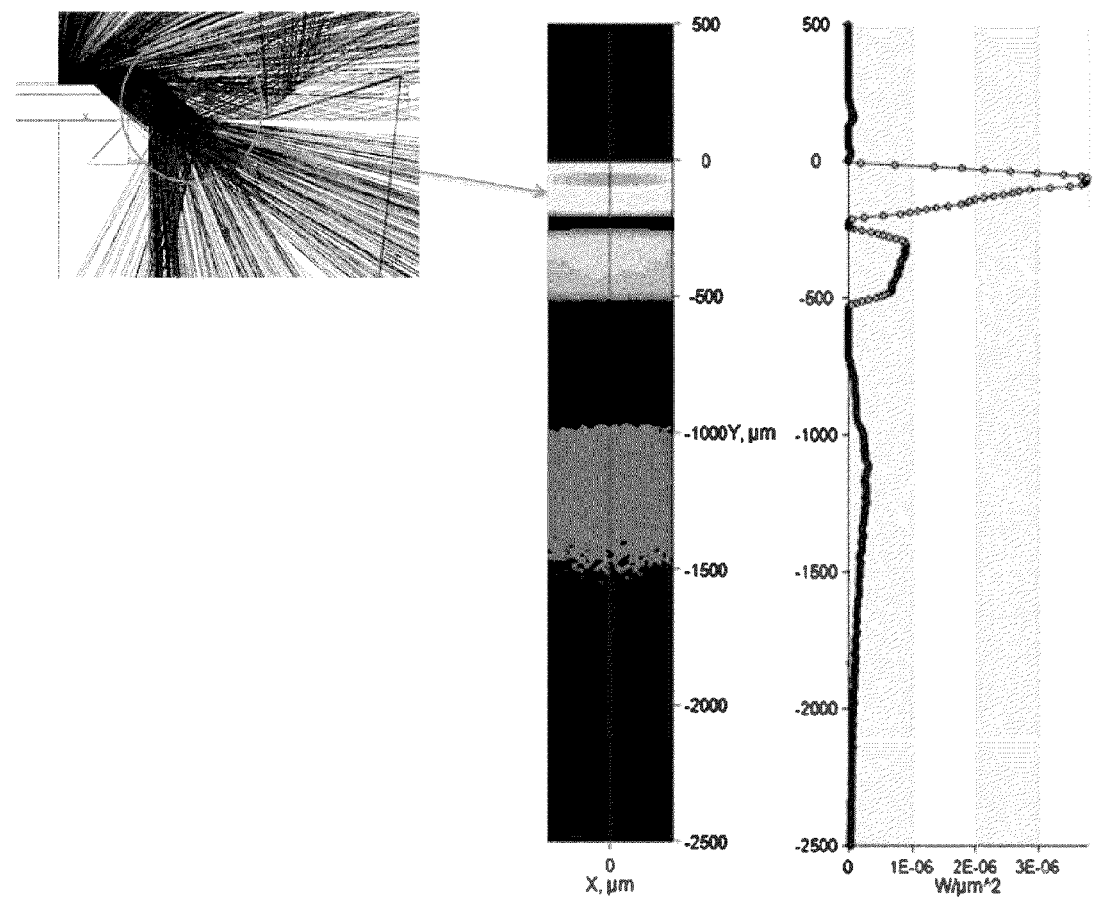

ORGANIC LIGHT EMITTING DIODE DISPLAY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims priority to, and the benefit of, Korean Patent Application No. 10-2015-0008150 filed in the Korean Intellectual Property Office on Jan. 16, 2015, the entire contents of which are incorporated herein by reference.

BACKGROUND

1. Field

The present disclosure relates to an organic light emitting diode display.

2. Description of the Related Technology

An organic light emitting diode display includes two electrodes and an organic emission layer interposed therebetween. Electrons injected from one electrode and holes injected from the other electrode are bonded to each other in the organic emission layer to form excitons, and light is emitted while the excitons discharge energy. The organic light emitting diode display displays a predetermined image by using the light emission.

Since the organic light emitting diode display has a self-luminance characteristic and does not require a separate light source unlike a liquid crystal display, a thickness and a weight thereof may be comparatively decreased. Further, the organic light emitting diode display has high quality characteristics, such as low power consumption, high luminance, and fast response speed, thereby getting a lot of attention as a next-generation display device.

The organic light emitting diode display includes an organic light emitting diode, and the organic light emitting diode includes an anode electrode, a cathode electrode, and an organic emission layer positioned between the anode electrode and the cathode electrode.

The organic light emitting diode display may be divided into a top emission type organic light emitting diode display in which light emitted from the organic light emitting diode is emitted through a top surface, and a bottom emission type organic light emitting diode display in which light emitted from the organic light emitting diode is emitted through a bottom surface.

In the bottom emission type organic light emitting diode display, an optical sensor may be attached to a lateral surface of a substrate, and the optical sensor may detect light emitted from the organic light emitting diode to recognize a deterioration degree of the organic light emitting diode.

However, in the top emission type organic light emitting diode display, there is little light incident into a lateral surface of a substrate, so that it may be difficult to detect light emitted from the organic light emitting diode by the same method as that of the bottom emission type.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The present disclosure has been made in an effort to provide a top emission type organic light emitting diode display, which is capable of detecting light emitted from an organic light emitting diode.

One embodiment provides an organic light emitting diode display, including: a substrate; an interlayer insulating layer disposed on the substrate; a driving source electrode and a driving drain electrode disposed on the interlayer insulating layer and facing each other; a planarizing layer disposed on the driving source electrode, the driving drain electrode, and the interlayer insulating layer; a pixel electrode disposed on the planarizing layer, and including a reflective electrode; a pixel defining layer disposed on an edge portion of the pixel electrode and the planarizing layer, and including an opening for exposing the pixel electrode and a reflective hole for exposing a part of the interlayer insulating layer; an organic emission layer disposed on the pixel electrode within the opening; a common electrode positioned on the organic emission layer and the pixel defining layer and within the reflective hole, and including a transparent electrode; and an optical sensor disposed under the substrate, in which the reflective hole moves light emitted from the organic emission layer to the optical sensor disposed under the substrate.

The common electrode disposed on a lateral surface of the reflective hole may reflect the light emitted from the organic emission layer and move the light to the optical sensor.

The organic light emitting diode display may further include: a buffer layer disposed on the substrate; a driving semiconductor layer disposed on the buffer layer; a gate insulating layer disposed on the driving semiconductor layer; and gate lines and a driving gate electrode disposed on the gate insulating layer.

The interlayer insulating layer is disposed on the gate lines, the driving gate electrode and the gate insulating layer.

The reflective hole may be disposed between the pixel electrode and the gate line according to a plane.

The reflective hole may be extended to the planarizing layer.

The planarizing layer may include an insulating layer exposing opening for exposing a part of the interlayer insulating layer.

The reflective hole may be positioned within the insulating layer exposing opening.

The pixel electrode may be extended to a lateral surface of the insulating layer exposing opening.

The organic light emitting diode display may further include: a switching semiconductor layer disposed on the buffer layer and spaced apart from the driving semiconductor layer; a switching gate electrode disposed on the gate insulating layer, spaced apart from the driving gate electrode, and connected with the gate line; a switching drain electrode and a data line disposed on the interlayer insulating layer, wherein the switching drain electrode is spaced apart from the data line crossing the gate line; and a driving voltage line disposed on the interlayer insulating layer, crossing the gate line, and spaced apart from the data line.

The data line may include a switching source electrode which protrudes toward the switching semiconductor layer and faces the switching drain electrode.

The driving source electrode may protrude from the driving voltage line toward the driving semiconductor layer.

The organic light emitting diode display may further include a first storage capacitor plate disposed on the gate insulating layer and spaced apart from the gate line.

The driving gate electrode may protrude from the first storage capacitor plate in a direction of the driving semiconductor layer.

The switching drain electrode may be electrically connected with the driving gate electrode through the first storage capacitor plate.

The driving voltage line may further include a second storage capacitor plate overlapping the first storage capacitor plate.

According to certain embodiments, it is possible to obtain a light quantity detectable by the optical sensor by forming the reflective hole between the pixel electrode and the gate line and moving light emitted from the organic light emitting diode to the optical sensor disposed under the substrate.

Accordingly, it is possible to recognize a degradation degree of the organic light emitting diode by detecting the light emitted from the organic light emitting diode by the optical sensor.

BRIEF DESCRIPTION OF THE DRAWINGS

FIG. 9 is a simulation result for a movement path of light of the organic light emitting diode display according to the embodiment.

DETAILED DESCRIPTION OF CERTAIN INVENTIVE EMBODIMENTS

Figure 1:
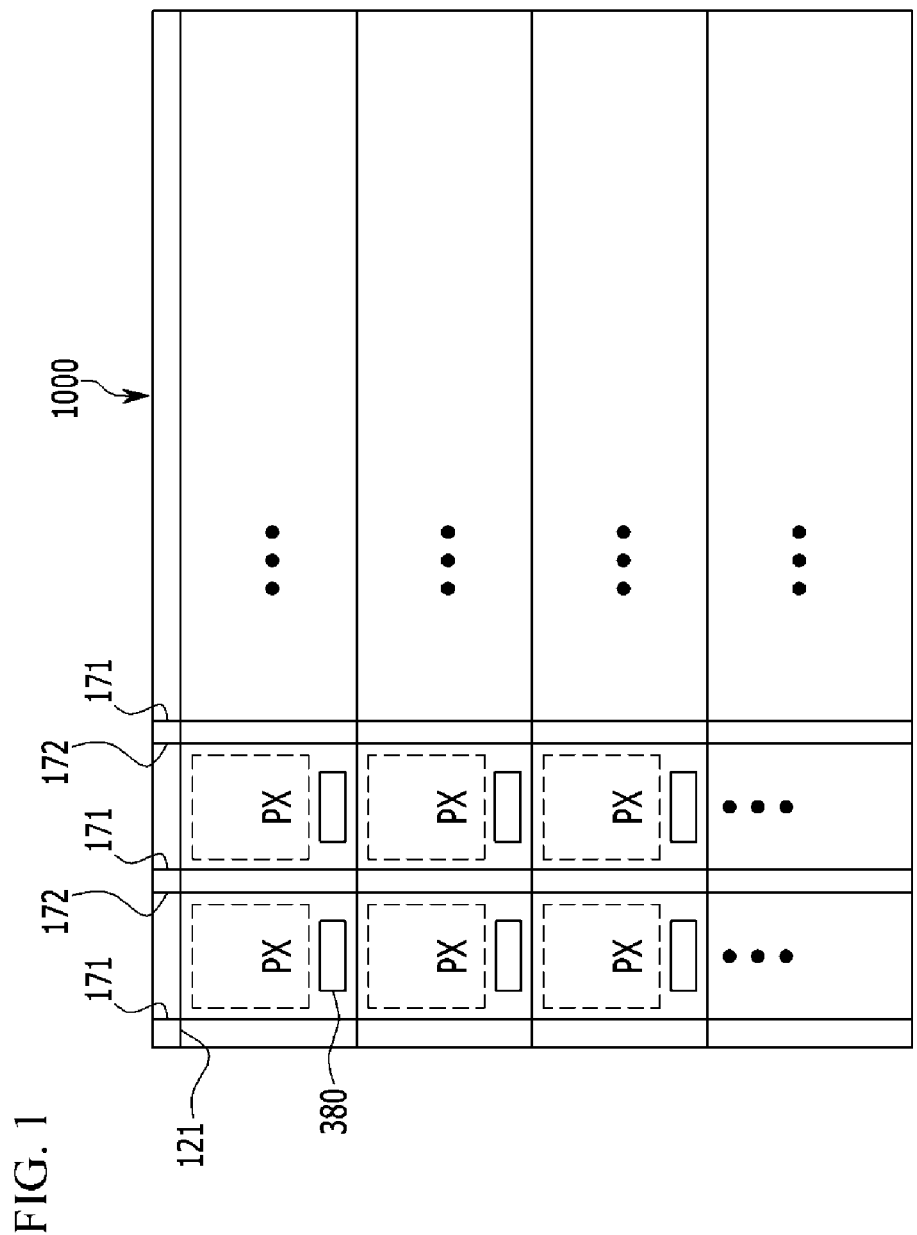
FIG. 1 is a diagram schematically illustrating a plane of an organic light emitting diode display according to an embodiment.

The present disclosure will be described more fully hereinafter with reference to the accompanying drawings, in which certain embodiments are shown. As those skilled in the art would realize, the described embodiments may be modified in various ways, without departing from the spirit or scope of the present invention.

In the disclosure, parts that are not related to the description are omitted. Like reference numerals generally designate like elements throughout the specification.

In addition, the size and thickness of each configuration shown in the drawings are arbitrarily shown for understanding and ease of description, but the present invention is not limited thereto.

In the drawings, the thickness of layers, films, panels, regions, and the like may be exaggerated for clarity. In the drawings, for convenience of the description, thicknesses of some layers and areas may be exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, the word "on" means positioning on or below the object portion, but does not necessarily mean positioning on the upper side of the object portion based on a gravity direction.

Further, throughout the specification, the term "according to a plane" means a case where a target portion is viewed from the above, and the term "according to a cross section" means a case where a cross section taken by vertically cutting a target portion is viewed from the side.

Figure 2:
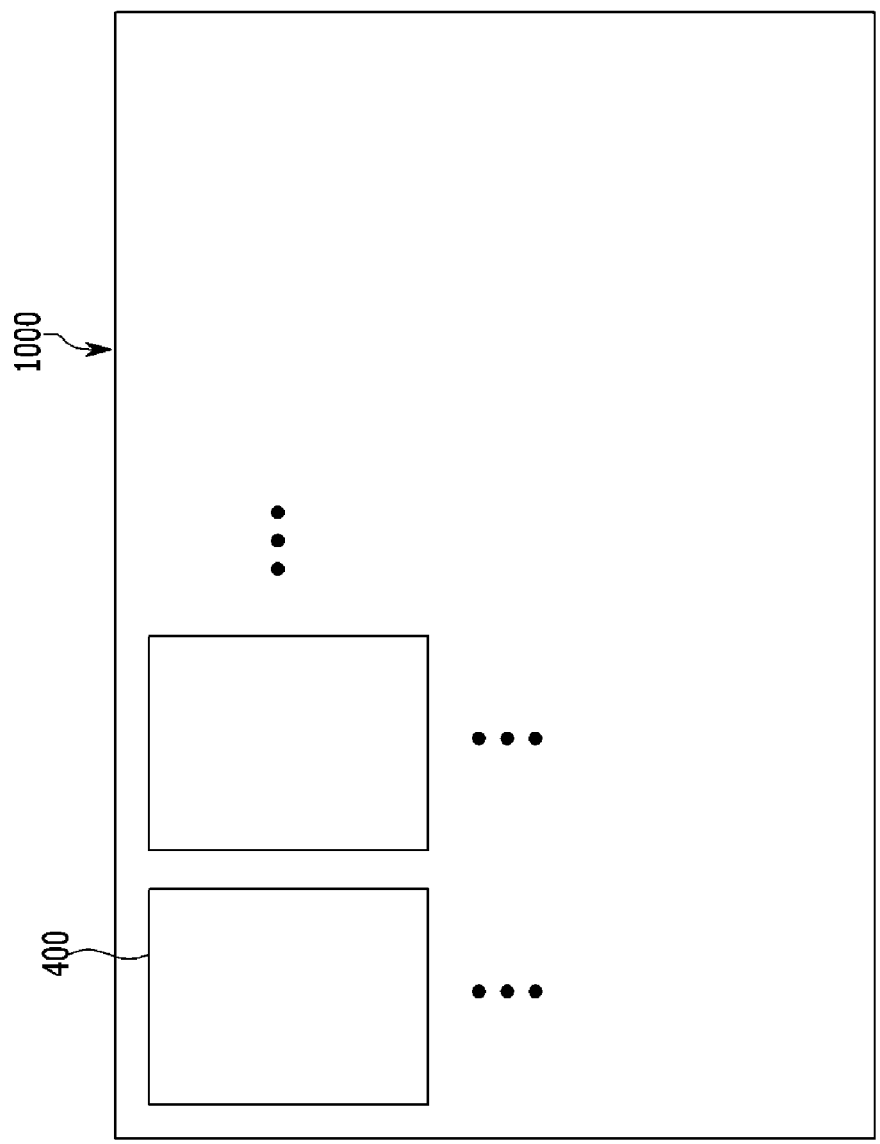
FIG. 2 is a diagram schematically illustrating a bottom surface of the organic light emitting diode display according to the embodiment.

FIG. 1 is a diagram schematically illustrating a plane of an organic light emitting diode display according to an embodiment. FIG. 2 is a diagram schematically illustrating a bottom surface of the organic light emitting diode display according to the embodiment.

Referring to FIGS. 1 and 2, an organic light emitting diode display includes a plurality of signal lines 121, 171, and 172, and a plurality of pixels PX connected to the plurality of signal lines and approximately arranged in a matrix form.

The signal lines include a plurality of gate lines 121 each transmitting a gate signal (or a scan signal), a plurality of data lines 171 each transmitting a data signal, and a plurality of driving voltage lines 172 each transmitting a driving voltage.

The gate lines 121 are approximately extended in a row direction and are parallel to each other, and the data lines 171 and driving voltage lines 172 are approximately extended in a column direction and are almost parallel to each other.

A reflection hole 380 is disposed between each pixel PX and each gate line 121.

The organic light emitting diode display includes a plurality of optical sensors 400 for detecting light emitted from the respective pixels PX. The optical sensor 400 is positioned on a bottom surface of the organic light emitting diode display 1000. Each optical sensor 400 covers the plurality of pixels PX.

The reflection hole 380 serves to move light emitted from the pixel PX in a direction of the optical sensor 400.

Figure 3:
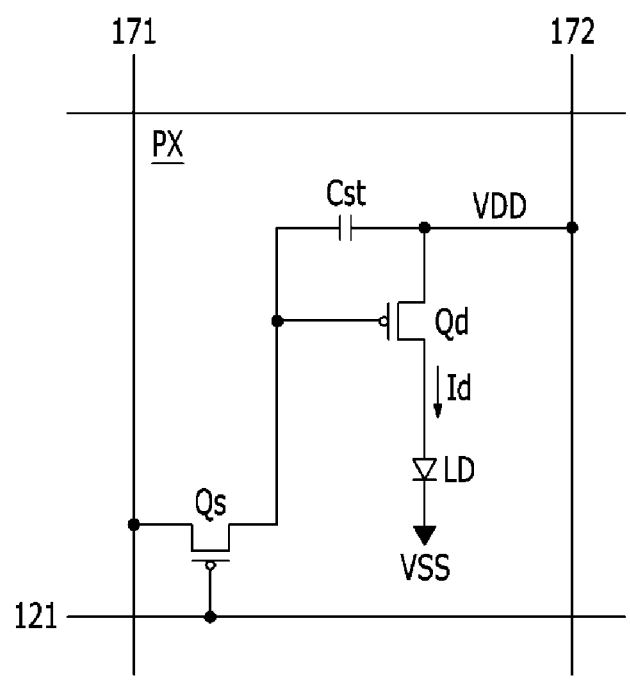
FIG. 3 is an equivalent circuit diagram of one pixel of the organic light emitting diode display according to the embodiment.

FIG. 3 is an equivalent circuit diagram of one pixel of the organic light emitting diode display according to the embodiment.

Referring to FIG. 3, the pixel PX is connected to the gate line 121, the data line 171, and the driving voltage line 172. Further, the pixel PX includes a switching thin film transistor Qs, a driving thin film transistor Qd, a storage capacitor Cst, and an organic light emitting diode LD.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs responds to the gate signal applied to the gate line 121 to transmit the data signal applied to the data line 171 to the driving thin film transistor Qd.

The driving thin film transistor Qd also includes a control terminal, an input terminal, and an output terminal. The control terminal is connected to the switching thin film transistor Qs, the input terminal is connected to the driving voltage line 172, and the output terminal is connected to the organic light emitting diode LD. The driving thin film transistor Qd allows an output current Id, having a level varying according to a voltage applied between the control terminal and the output terminal, to flow.

The storage capacitor Cst is connected between the control terminal and the input terminal of the driving thin film transistor Qd. The storage capacitor Cst charges the data signal applied to the control terminal of the driving thin film transistor Qd and maintains the charged data signal even after the switching thin film transistor Qs is turned off.

The organic light emitting diode LD includes an anode connected to the output terminal of the driving thin film transistor Qd, and a cathode connected to a common voltage Vss. The organic light emitting diode LD displays an image by emitting light with intensity varying according to the output current Id of the driving thin film transistor Qd.

The switching thin film transistor Qs and the driving thin film transistor Qd may be n channel field effect transistors (FET) or p channel field effect transistors. Further, the connection relation of the switching and driving thin film transistors Qs and Qd, the storage capacitor Cst, and organic light emitting diode LD may be changed in other embodiments.

Figure 4:
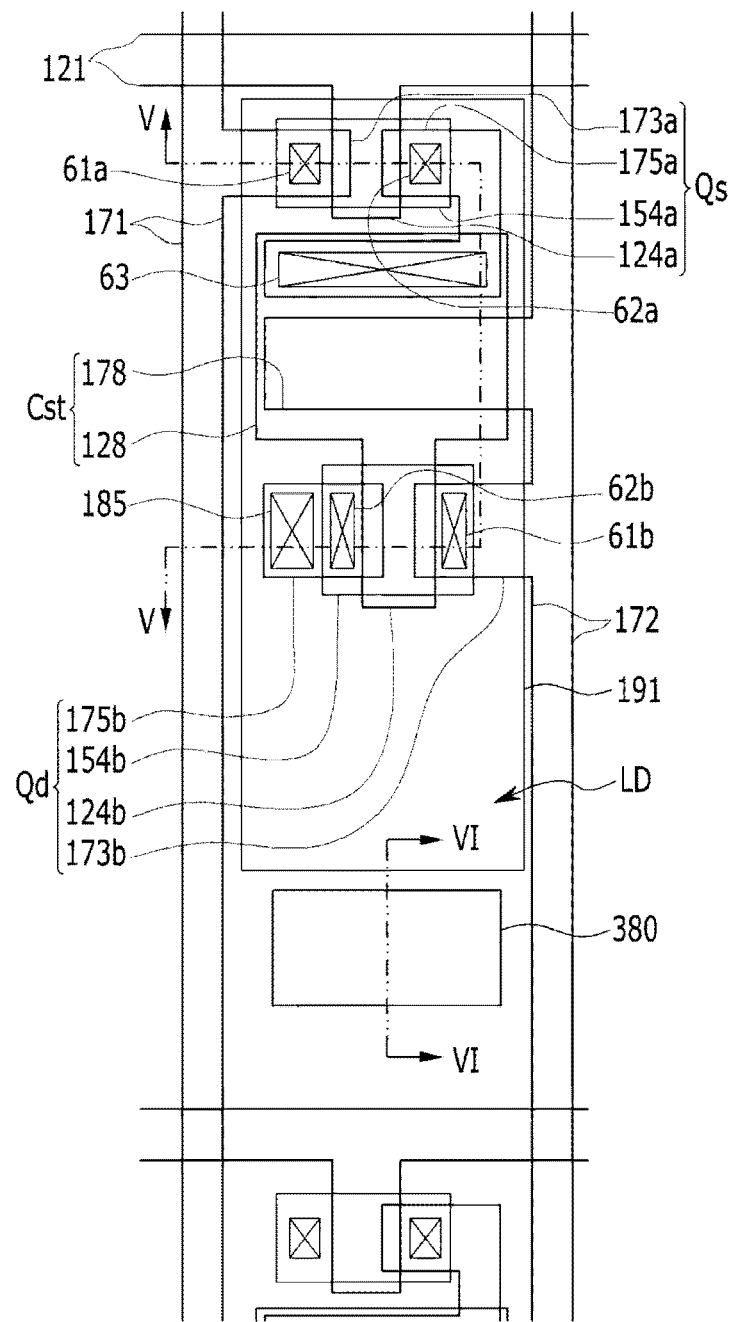
FIG. 4 is a layout view of one pixel of the organic light emitting diode display according to the embodiment.
Figure 5:
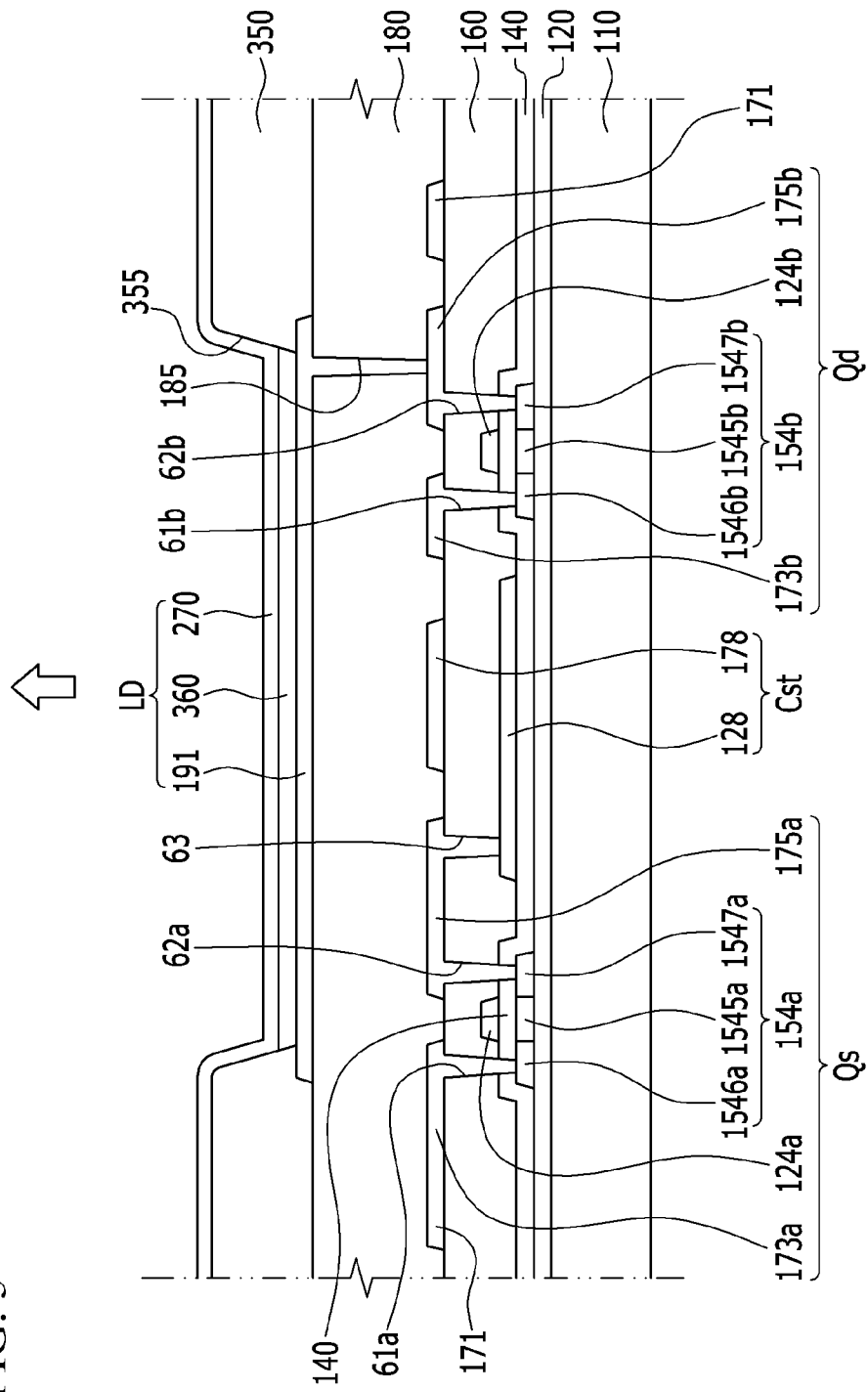
FIG. 5 is a diagram illustrating one example of a cross section taken along line V-V of the organic light emitting diode display of FIG. 4.
Figure 6:
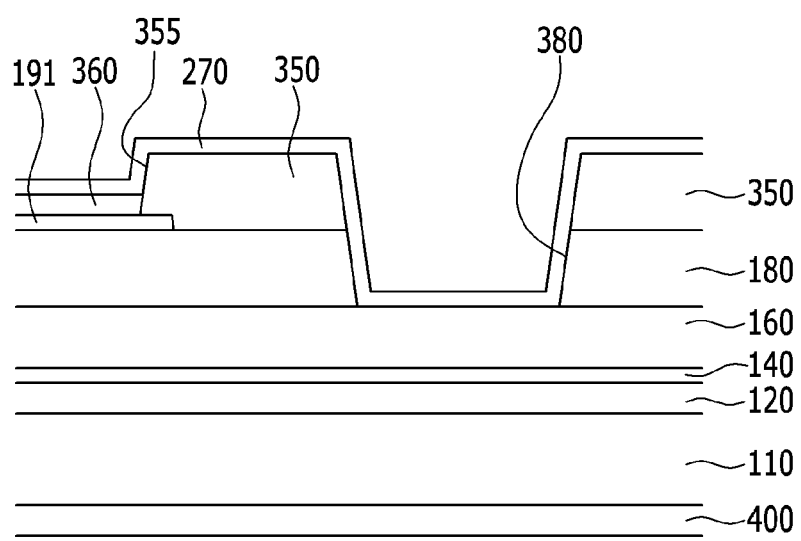
FIG. 6 is a diagram illustrating one example of a cross section taken along line VI-VI of the organic light emitting diode display of FIG. 4.

FIG. 4 is a layout view of one pixel of the organic light emitting diode display according to the embodiment. FIG. 5 is a diagram illustrating one example of a cross section taken along line V-V of the organic light emitting diode display of FIG. 4. FIG. 6 is a diagram illustrating one example of a cross section taken along line VI-VI of the organic light emitting diode display of FIG. 4.

Referring to FIGS. 4 to 6, in the organic light emitting diode display, a plurality of thin film structures is disposed on a substrate 110. Hereinafter, the plurality of thin film structures will be described in detail.

A buffer layer 120 is disposed on the substrate 110. The substrate 110 may be a transparent insulating substrate including glass, quartz, ceramics, plastics, or the like. Further, the substrate 110 may be a metal substrate including stainless steel, or the like.

The buffer layer 120 may be formed of a single layer of a silicon nitride (SiNx) or double layers in which a silicon nitride (SiNx) and a silicon oxide (SiO$_2$) are stacked. The buffer layer 120 serves to prevent unnecessary components, such as an impurity or moisture, from permeating, and to planarize the surface.

A switching semiconductor layer 154a and a driving semiconductor layer 154b are separately disposed on the buffer layer 120. The switching semiconductor layer 154a includes polycrystalline silicon, and includes a switching channel region 1545a, a switching source region 1546a, and a switching drain region 1547a. The driving semiconductor layer 154b includes polycrystalline silicon, and includes a driving channel region 1545b, a driving source region 1546b, and a driving drain region 1547b. The switching source region 1546a and the switching drain region 1547a are disposed at both sides of the switching channel region 1545a, and the driving source region 1546b and the driving drain region 1547b are disposed at both sides of the driving channel region 1545b.

The switching and driving channel regions 1545a and 1545b are polycrystalline silicon, an intrinsic semiconductor, in which an impurity is not doped, and the switching and driving source regions 1546a and 1546b and the switching and driving drain regions 1547a and 1547b are polycrystalline silicon, an impurity semiconductor, in which a conductive impurity is doped.

A gate insulating layer 140 is disposed on the buffer layer 120, the switching semiconductor layer 154a, and the driving semiconductor layer 154b. The gate insulating layer 140 may be a single layer or a multilayer including at least one of a silicon nitride and a silicon oxide.

The gate line 121 and a first storage capacitor plate 128 are disposed on the gate insulating layer 140.

The gate line 121 is elongated in a horizontal direction and transmits the gate signal, and includes a switching gate electrode 124a protruding from the gate line 121 toward the switching semiconductor layer 154a. The switching gate electrode 124a overlaps the switching channel region 1545a.

The first storage capacitor plate 128 includes a driving gate electrode 124b protruding from the first storage capacitor plate 128 toward the driving semiconductor layer 154b. The driving gate electrode 124b overlaps the driving channel region 1545b.

An interlayer insulating layer 160 is disposed on the gate line 121, the first storage capacitor plate 128, and the buffer layer 120. The interlayer insulating layer 160 may be a single layer or a multilayer including at least one of a silicon nitride and a silicon oxide.

The interlayer insulating layer 160 and the gate insulating layer 140 are provided with a switching source exposing opening 61a and a switching drain exposing opening 62a for exposing the switching source region 1546a and the switching drain region 1547a, respectively. Further, the interlayer insulating layer 160 and the gate insulating layer 140 are provided with a driving source exposing opening 61b and a driving drain exposing opening 62b for exposing the driving source region 1546b and the driving drain region 1547b, respectively. Further, the interlayer insulating layer 160 is provided with a first contact hole 63 for exposing a part of the first storage capacitor plate 128.

The data line 171, the driving voltage line 172, the switching drain electrode 175a, and the driving drain electrode 175b are disposed on the interlayer insulating layer 160.

The data line 171 transmits the data signal and is extended in a direction crossing the gate line 121, and includes a switching source electrode 173a protruding from the data line 171 toward the switching semiconductor layer 154a.

The driving voltage line 172 transmits a driving voltage, is separated from the data line 171, and is extended in the same direction as that of the data line 171. The driving voltage line 172 includes a driving source electrode 173b protruding from the driving voltage line 172 toward the driving semiconductor layer 154b, and a second storage capacitor plate 178 protruding from the driving voltage line 172 and overlapping the first storage capacitor plate 128. The first storage capacitor plate 128 and the second storage capacitor plate 178 form the storage capacitor Cst by using the interlayer insulating layer 160 as a dielectric.

The switching drain electrode 175a faces the switching source electrode 173a, and the driving drain electrode 175b faces the driving source electrode 173b.

The switching source electrode 173a and switching drain electrode 175a are connected with the switching source region 1546a and the switching drain region 1547a respectively through the switching source exposing opening 61a and the switching drain exposing opening 62a, respectively. Further, the switching drain electrode 175a is electrically connected with the first storage capacitor plate 128 and the driving gate electrode 124b through the first contact hole 63 formed in the extended interlayer insulating layer 160.

The driving source electrode 173b and the driving drain electrode 175b are connected with the driving source region 1546b and the driving drain region 1547b respectively through the driving source exposing opening 61b and the driving drain exposing opening 62b, respectively.

The switching semiconductor layer 154a, the switching gate electrode 124a, the switching source electrode 173a, and the switching drain electrode 175a form the switching thin film transistor Qs. The driving semiconductor layer 154b, the driving gate electrode 124b, and the driving source electrode 173b, and the driving drain electrode 175b form the driving thin film transistor Qd.

A planarizing layer 180 is disposed on the interlayer insulating layer 160, the data line 171, the driving voltage line 172, the switching drain electrode 175a, and the driving drain electrode 175b. The planarizing layer 180 may include an organic material, and an upper surface thereof is planarized. The planarizing layer 180 is provided with a second contact hole 185 for exposing the driving drain electrode 175b.

The organic light emitting diode LD and a pixel defining layer 350 are disposed on the planarizing layer 180.

The organic light emitting diode LD includes the pixel electrode 191, an organic emission layer 360, and a common electrode 270.

The pixel electrode 191 is disposed on the planarizing layer 180, and is electrically connected with the driving drain electrode 175b of the driving thin film transistor Qd through the second contact hole 185 formed in the planarizing layer 180. The pixel electrode 191 becomes the anode electrode of the organic light emitting diode LD.

The pixel electrode 191 may include a reflective metal, such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 350 is disposed on an edge portion of the pixel electrode 191 and the planarizing layer 180, and is provided with an opening 355 for exposing the pixel electrode 191. The pixel defining layer 350 may include a resin, such as, for example, a polyacrylate-based resin or a polyimide-based resin.

The organic emission layer 360 is disposed on the pixel electrode 191 within the opening 355 of the pixel defining layer 350.

The organic emission layer 360 is formed of a multilayer including one or more of an emission layer, a hole-injection layer (HIL), a hole-transporting layer (HTL), an electron-transporting layer (ETL), and an electron-injection layer (EIL). When the organic emission layer 360 includes all of the emission layer, the hole-injection layer (HIL), the hole-transporting layer (HTL), the electron-transporting layer (ETL), and the electron-injection layer (EIL), the HIL may be positioned on the pixel electrode 191 that is the anode electrode, and the HTL, the emission layer, the ETL, and the EIL may be sequentially stacked on the pixel electrode 191.

The organic emission layer 360 may include a red organic emission layer emitting light having a red color, a green organic emission layer emitting light having a green color, and a blue organic emission layer emitting light having a blue color. The red organic emission layer, the green organic emission layer, and the blue organic emission layer may be formed in a red pixel, a green pixel, and a blue pixel, respectively, to implement a color image.

Further, in the organic emission layer 360, all of the red organic emission layer, the green organic emission layer, and the blue organic emission layer are stacked together in the red pixel, the green pixel, and the blue pixel. A red color filter, a green color filter, and a blue color filter are formed for each pixel, so that the organic emission layer 360 may implement a color image. In another example, a white organic emission layer emitting light having a white color may be formed in all of the red pixel, the green pixel, and the blue pixel, and the red color filter, the green color filter, and the blue color filter may be formed for each pixel to implement a color image. When the color image is implemented by using the white organic emission layer and the color filters, it is not necessary to use deposition masks for depositing the red organic emission layer, the green organic emission layer, and the blue organic emission layer on the respective pixels, that is, the red pixel, the green pixel, and the blue pixel.

A white organic emission layer in another example may include one organic emission layer, and include a configuration in which a plurality of organic emission layers is stacked to emit light having the white color. For example, the white organic emission layer may include a configuration in which at least one yellow organic emission layer and at least one blue organic emission layer are combined to emit light having the white color, a configuration in which at least one cyan organic emission layer and at least one red organic emission layer are combined to emit light having the white color, or a configuration in which at least one magenta organic emission layer and at least one green organic emission layer are combined to emit light having the white color.

The pixel defining layer 350 and the planarizing layer 180 are provided with a reflective hole 380 for exposing a part of the interlayer insulating layer 160. The metal layers, including the gate line 121 and the data line 171, are not positioned under the reflective hole 380. The reflective hole 380 is disposed between the pixel electrode 191 and the gate line 121 according to a plane.

The common electrode 270 is disposed on the pixel defining layer 350 and the organic emission layer 360. Further, the common electrode 270 is disposed within the reflective hole 380. The common electrode 270 includes a transparent conductive material such as, for example, ITO, IZO, ZnO, or $In_2O_3$. The common electrode 270 becomes the cathode electrode of the organic light emitting diode LD.

The optical sensor 400 is disposed under the first substrate 110. The optical sensor 400 may detect light emitted from the organic emission layer 360 and recognize a degradation degree of the organic emission layer 360.

A sealing substrate, which is bonded with the first substrate 110 by an encapsulating material (not illustrated) to serve as an encapsulation substrate, may be disposed on the common electrode 270. Further, a sealing thin film including an organic material or an inorganic material may be disposed on the common electrode 270.

A movement of light emitted from the organic emission layer is described with reference to FIG. 7.

Figure 7:
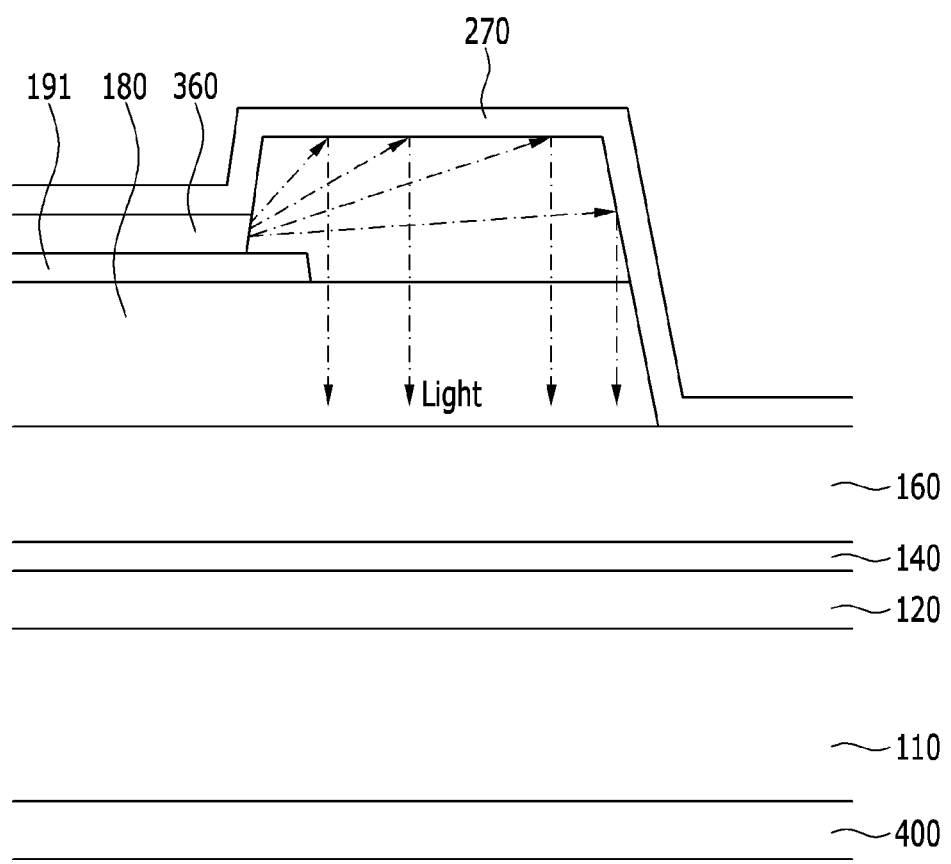
FIG. 7 is a diagram illustrating a movement of light of the organic light emitting diode display according to the embodiment.

FIG. 7 is a diagram illustrating a movement of light of the organic light emitting diode display according to the embodiment.

Referring to FIG. 7, light emitted from the organic emission layer 360 is reflected from the pixel electrode 191 and emitted to an upper portion to meet the common electrode 270. The common electrode 270 includes a transparent conductive material, but the light emitted from the organic emission layer 360 does not pass through the common electrode 270 100%, and a part of the light is reflected from the common electrode 270.

Accordingly, the light emitted from the organic emission layer 360 is reflected by the common electrode 270 to pass through a rear surface of the substrate 110. Further, the light emitted from the organic emission layer 360 is reflected by the common electrode 270 disposed at a lateral surface of the reflective hole 380 to pass through the rear surface of the substrate 110. The light passing through the rear surface of the substrate 110 is detected by the optical sensor 400. The reflective hole 380 serves to change a path of the light emitted from the organic emission layer 360.

As described above, the light emitted from the organic emission layer 360, which moves to the lateral surface of the substrate 110, moves to the rear surface of the substrate 110 by the reflective hole 380, so that it is possible to obtain a light quantity detectable by the optical sensor 400.

A movement of light emitted from the organic emission layer is described with reference to FIGS. 8 and 9.

Figure 8:
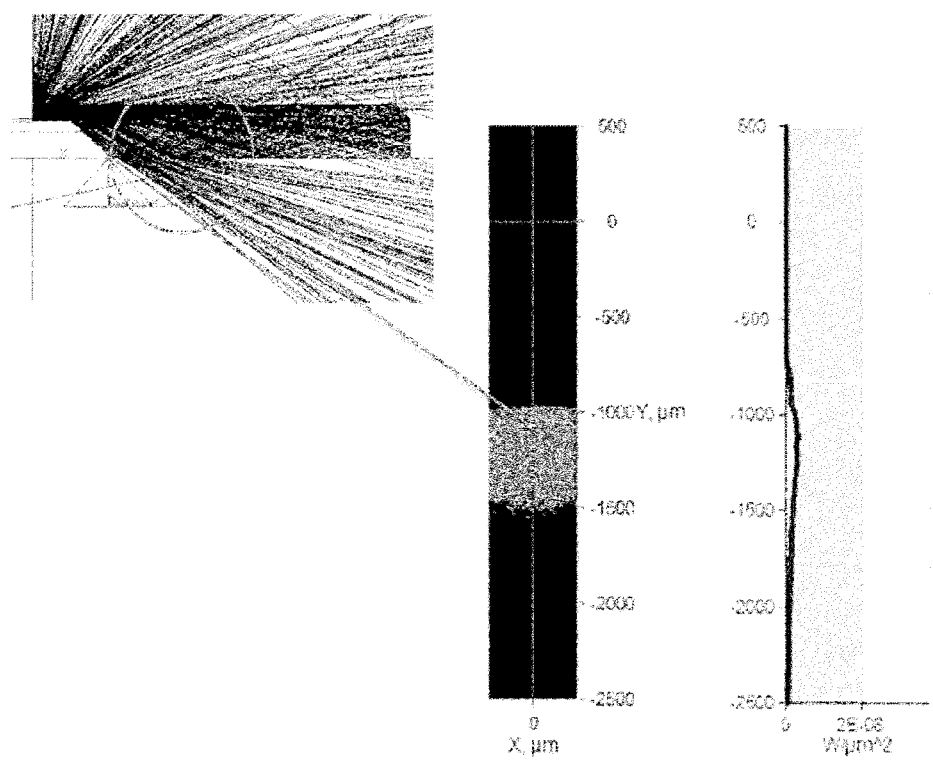
FIG. 8 is a simulation result for a movement path of light of the organic light emitting diode display in which a reflection hole is not formed.

FIG. 8 is a simulation result for a movement path of light of the organic light emitting diode display in which a reflection hole is not formed. FIG. 9 is a simulation result for a movement path of light of the organic light emitting diode display according to the embodiment.

In comparing simulation results of FIGS. 8 and 9, it can be seen that a light quantity moving to the rear surface of the substrate in the case of FIG. 9 is larger than that of the case of FIG. 8. It can be seen that in the organic light emitting diode display provided with the reflective hole, light emitted from the organic emission layer moves to the rear surface of the substrate, so that it is possible to obtain a light quantity detectable by the optical sensor disposed on the rear surface of the substrate.

Hereinafter, an organic light emitting diode display according to another embodiment will be described with reference to FIGS. 10 and 11.

Figure 10:
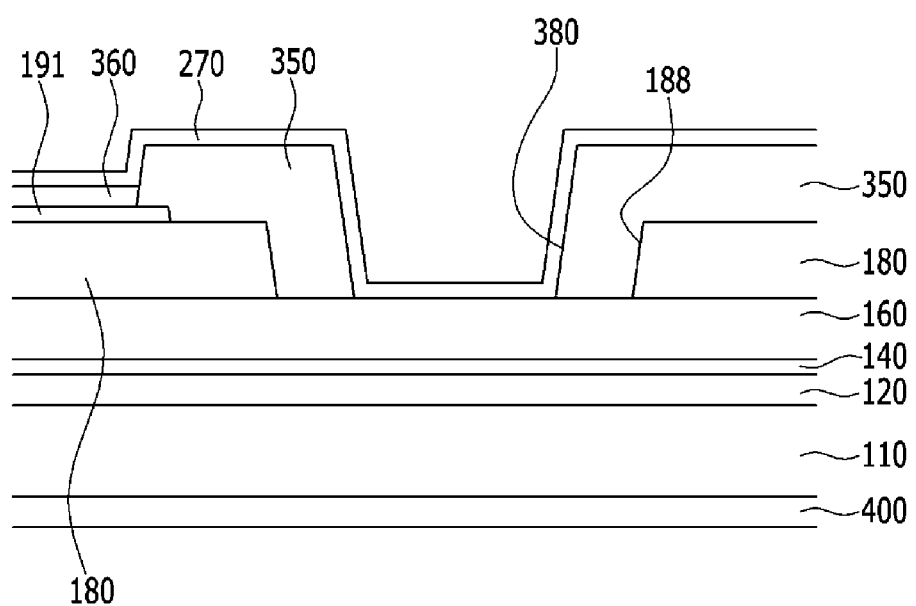
FIG. 10 is a diagram illustrating one example of a cross section of an organic light emitting diode display according to another embodiment.

FIG. 10 is a diagram illustrating one example of a cross section of an organic light emitting diode display according to another embodiment.

Referring to FIG. 10, the organic light emitting diode display is different from the organic light emitting diode display of FIG. 2 only in a structure of the reflective hole, and the remaining structures thereof are the same as those of the organic light emitting diode display of FIG. 2. Accordingly, a description of the same structures will be omitted.

An insulating layer exposing opening 188 is formed in the planarizing layer 180, and the reflective hole 380 is disposed in the pixel defining layer 350. The insulating layer exposing opening 188 and the reflective hole 380 expose a part of the interlayer insulating layer 160. The reflective hole 380 is disposed within the insulating layer exposing opening 188. A width of the insulating layer exposing opening 188 is larger than a width of the reflective hole 380. Accordingly, a part of the pixel defining layer 350 is positioned on the interlayer insulating layer 160 which is exposed by the insulating layer exposing opening 188.

Light emitted from an organic emission layer 360 is reflected by the common electrode 270 to pass through a rear surface of a substrate 110. Further, the light emitted from the organic emission layer 360 is reflected by the common electrode 270 disposed at a lateral surface of the reflective hole 380 to pass through the rear surface of the substrate 110. The light passing through the rear surface of the substrate 110 is detected by an optical sensor 400.

Figure 11:
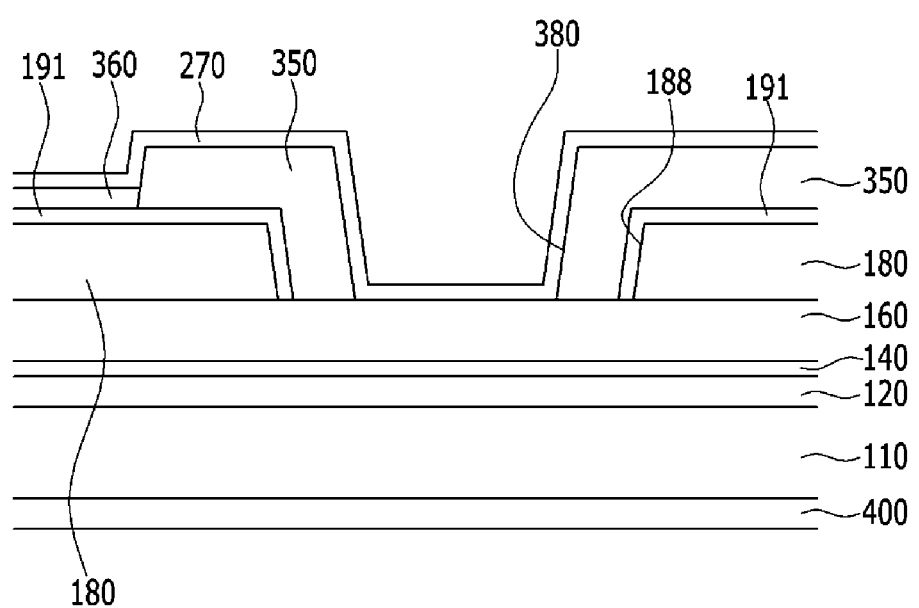
FIG. 11 is a diagram illustrating one example of a cross-section of an organic light emitting diode display according to yet another embodiment.

FIG. 11 is a diagram illustrating one example of a cross-section of an organic light emitting diode display according to yet another embodiment.

Referring to FIG. 11, the organic light emitting diode display is different from the organic light emitting diode display of FIG. 2 only in a structure of the reflective hole, but the remaining structures thereof are the same as those of the organic light emitting diode display of FIG. 2. Accordingly, a description of the same structures will be omitted.

An insulating layer exposing opening 188 is formed in the planarizing layer 180, and the reflective hole 380 is disposed in the pixel defining layer 350. The insulating layer exposing opening 188 and the reflective hole 380 expose a part of the interlayer insulating layer 160. The reflective hole 380 is disposed within the insulating layer exposing opening 188. A width of the insulating layer exposing opening 188 is larger than a width of the reflective hole 380. Accordingly, a part of the pixel defining layer 350 is positioned on the interlayer insulating layer 160 which is exposed by the insulating layer exposing opening 188.

A pixel electrode 191 is extended to a lateral surface of the insulating layer exposing opening 188. Accordingly, the light emitted from the organic emission layer 360 is reflected by the common electrode 270 and moves in a direction of the rear surface of the substrate 110 to meet the pixel electrode 191, and thus the light is reflected by the pixel electrode 191 to meet the common electrode 270. The light emitted from the organic emission layer 360 is reflected by the common electrode 270 disposed at a lateral surface of the reflective hole 380 while repeating the movement to move to the rear surface of the substrate 110. The light moving to the rear surface of the substrate 110 is detected by an optical sensor 400.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: Substrate
121: Gate line
124*a*, 124*b*: Switching and driving gate electrodes
128: First storage capacitor plate
154*a*: Switching semiconductor layer
154*b*: Driving semiconductor layer
160: Interlayer insulating layer
171: Data line
172: Driving voltage line
173*a*, 173*b*: Switching and driving source electrodes
175*a*, 175*b*: Switching and driving drain electrodes
178: Second storage capacitor plate
180: Planarizing layer
188: Insulating layer exposing opening
191: pixel electrode
270: Common electrode
350: Pixel defining layer
360: Organic emission layer
380: Reflective hole
400: Optical sensor

What is claimed is:

1. An organic light emitting diode display, comprising:
a substrate;

an interlayer insulating layer disposed on the substrate;
a driving source electrode and a driving drain electrode disposed on the interlayer insulating layer and facing each other;
a planarizing layer disposed on the driving source electrode, the driving drain electrode, and the interlayer insulating layer;
a pixel electrode disposed on the planarizing layer and including a reflective electrode;
a pixel defining layer disposed on an edge portion of the pixel electrode and the planarizing layer, and including an opening for exposing the pixel electrode and a reflective hole for exposing a part of the interlayer insulating layer;
an organic emission layer disposed on the pixel electrode within the opening;
a common electrode positioned on the organic emission layer and the pixel defining layer and within the reflective hole, and including a transparent electrode; and
an optical sensor disposed under the substrate,
wherein the reflective hole moves light emitted from the organic emission layer to the optical sensor disposed under the substrate.

2. The organic light emitting diode display of claim 1, wherein the common electrode disposed on a lateral surface of the reflective hole reflects the light emitted from the organic emission layer and moves the light to the optical sensor.

3. The organic light emitting diode display of claim 1 further comprising:
a buffer layer disposed on the substrate;
a driving semiconductor layer disposed on the buffer layer;
a gate insulating layer disposed on the driving semiconductor layer; and
gate lines and a driving gate electrode disposed on the gate insulating layer.

4. The organic light emitting diode display of claim 2, wherein the interlayer insulating layer is disposed on the gate lines, the driving gate electrode and the gate insulating layer.

5. The organic light emitting diode display of claim 2, wherein the reflective hole is disposed between the pixel electrode and the gate line according to a plane.

6. The organic light emitting diode display of claim 5, wherein the reflective hole is extended to the planarizing layer.

7. The organic light emitting diode display of claim 5, wherein the planarizing layer includes an insulating layer exposing opening for exposing a part of the interlayer insulating layer.

8. The organic light emitting diode display of claim 7, wherein the reflective hole is positioned within the insulating layer exposing opening.

9. The organic light emitting diode display of claim 8, wherein the pixel electrode is extended to a lateral surface of the insulating layer exposing opening.

10. The organic light emitting diode display of claim 3, further comprising:
a switching semiconductor layer disposed on the buffer layer and spaced apart from the driving semiconductor layer;
a switching gate electrode disposed on the gate insulating layer, spaced apart from the driving gate electrode, and connected with the gate line;
a switching drain electrode and a data line disposed on the interlayer insulating layer, wherein the switching drain electrode is spaced apart from the data line crossing the gate line; and
a driving voltage line disposed on the interlayer insulating layer, crossing the gate line, and spaced apart from the data line.

11. The organic light emitting diode display of claim 10, wherein the data line includes a switching source electrode which protrudes toward the switching semiconductor layer and faces the switching drain electrode.

12. The organic light emitting diode display of claim 11, wherein the driving source electrode protrudes from the driving voltage line toward the driving semiconductor layer.

13. The organic light emitting diode display of claim 12, further comprising a first storage capacitor plate disposed on the gate insulating layer and spaced apart from the gate line.

14. The organic light emitting diode display of claim 13, wherein the driving gate electrode protrudes from the first storage capacitor plate in a direction of the driving semiconductor layer.

15. The organic light emitting diode display of claim 14, wherein the switching drain electrode is electrically connected with the driving gate electrode through the first storage capacitor plate.

16. The organic light emitting diode display of claim 15, wherein the driving voltage line further includes a second storage capacitor plate overlapping the first storage capacitor plate.

* * * * *